(12) United States Patent
Surico et al.

(10) Patent No.: US 7,769,943 B2
(45) Date of Patent: Aug. 3, 2010

(54) FLEXIBLE, LOW COST APPARATUS AND METHOD TO INTRODUCE AND CHECK ALGORITHM MODIFICATIONS IN A NON-VOLATILE MEMORY

(75) Inventors: Stefano Surico, Milan (IT); Stefano Sivero, Capriate (IT); Simone Bartoli, Cambiago (IT); Marco Passerini, Lozza (IT)

(73) Assignee: Atmel Corporation, San Jose, CA (US)

( * ) Notice: Subject to any disclaimer, the term of this patent is extended or adjusted under 35 U.S.C. 154(b) by 617 days.

(21) Appl. No.: 11/696,288

(22) Filed: Apr. 4, 2007

(65) Prior Publication Data

US 2008/0250191 A1 Oct. 9, 2008

(51) Int. Cl.
G06F 12/00 (2006.01)
(52) U.S. Cl. .................. 711/103; 365/185.33; 714/718
(58) Field of Classification Search ................. 711/103; 365/185.33; 714/718
See application file for complete search history.

(56) References Cited

U.S. PATENT DOCUMENTS

| | | | |
|---|---|---|---|
| 4,400,798 A | 8/1983 | Francis et al. | |
| 4,580,216 A * | 4/1986 | Bellay et al. | ................... 712/37 |
| 4,610,000 A | 9/1986 | Lee | |
| 4,802,119 A | 1/1989 | Heene et al. | |
| 5,623,665 A | 4/1997 | Shimada et al. | |
| 5,757,690 A | 5/1998 | McMahon | |
| 5,872,994 A * | 2/1999 | Akiyama et al. | ............... 712/43 |
| 5,983,337 A | 11/1999 | Mahalingaiah et al. | |
| 6,260,157 B1 | 7/2001 | Schurecht et al. | |
| 6,438,664 B1 * | 8/2002 | McGrath et al. | ............ 711/154 |
| 6,453,397 B1 | 9/2002 | Okuda | |
| 6,463,549 B1 | 10/2002 | Shperber et al. | |
| 6,724,680 B1 | 4/2004 | Ng et al. | |
| 6,785,174 B2 | 8/2004 | Messina et al. | |
| 6,874,073 B2 | 3/2005 | Mahrla | |
| 6,925,521 B2 | 8/2005 | Li et al. | |
| 7,006,377 B2 | 2/2006 | Oh | |
| 2003/0120860 A1 * | 6/2003 | Sun et al. | .................... 711/103 |
| 2003/0217227 A1 | 11/2003 | Parthasarathy et al. | |
| 2004/0071028 A1 * | 4/2004 | Messina et al. | ............. 365/202 |
| 2006/0036803 A1 * | 2/2006 | Edan et al. | .................. 711/103 |

FOREIGN PATENT DOCUMENTS

WO    WO-2008/124094 A1    10/2008

OTHER PUBLICATIONS

"International Application Serial No. PCT/US2008/04446, International Search Report mailed Jul. 8, 2008", 2 pgs.
"International Application Serial No. PCT/US2008/04446, Written Opinion mailed Jul. 8, 2008", 5 pgs.

* cited by examiner

*Primary Examiner*—Brian R Peugh
*Assistant Examiner*—Hashem Farrokh
(74) *Attorney, Agent, or Firm*—Schwegman, Lundberg & Woessner, P.A.

(57) ABSTRACT

A flash memory includes input/output buffers, a memory array having memory cells coupled to the input/output buffers, and row and column decoders, and a voltage-generator circuit coupled to the row and column decoders. A microcontroller is coupled to the command user interface. Switch-instruction circuitry selectively provides instructions to the microcontroller from the read-only memory and from off chip through on-board t-latches coupled to the input/output buffers under control of a command user interface.

5 Claims, 7 Drawing Sheets

FLEXIBLE, LOW COST APPARATUS AND METHOD TO INTRODUCE AND CHECK ALGORITHM MODIFICATIONS IN A NON-VOLATILE MEMORY

BACKGROUND OF THE INVENTION

1. Field of the Invention

The present invention relates in general to non-volatile memories. More particularly, the present invention relates to non-volatile memories in which an embedded algorithm executed from a ROM is required.

2. The Prior Art

Current flash memories execute embedded algorithms to handle all modify operations. All these operations have become increasingly complex both because the number of allowed operations have been increased and because technology problems require very complex flows of digital and analog operations to be managed by an embedded microcontroller.

It is possible to check a lot of single circuitry functionality on a prototype chip, but usually the algorithm flows can only be verified in the on-chip implemented version. It is not possible to change these flows because the microcontroller executes instructions from a read-only memory (ROM) and a change to one or more masks is needed to change the stored code.

Current flash memories have a great complexity and the embedded algorithm has to execute numerous tasks such as factory programming, enhanced factory programming, non-volatile protection of sectors, etc. In particular there are multi-level devices that require very complex algorithms. The fact that process evolution has become increasingly faster causes great variations in technology parameters. Subsequent changes in parameters such as the applied voltages and timing during modify operations are required in order to match the technological requirements. All these issues necessitate changes in the algorithm flow. These changes may occur more than one time from first prototype chip to the final production of the device, and often the changes must be directly checked on silicon.

All modify operations in a flash memory device are obtained by applying well-defined voltage values to selected and not selected memory cells. These voltages are different accordingly to each operation and must be applied for timings that depend on the specific technology. Each modify operation employs a very high number of sequences that in the latest-generation devices requires several thousands of instructions. Usually a microcontroller decodes and executes the right sequence of instructions for the operation required from the user. All these instructions are usually stored in a ROM (Read Only Memory) that has both the advantages of a low area occupation and of a non-volatile memory. The memory that stores algorithm instructions has to be non-volatile because the flow has to be available after the power on of the device. Even if a dedicated flash area could be used to store the algorithm, this would require a high area cost and would not allow a fast access to execute the algorithm since reading from a ROM is much faster than from flash cells. On the other hand, the great disadvantage of using a ROM to store the algorithm instructions is the need of a mask set request in order to modify any flow, as previously explained.

It is sometimes necessary to modify an algorithm in order to correct design bugs. The algorithm flow is fixed in the prototype chip in an embedded ROM by a VIA mask. It is not possible to change these flows without at least a new mask release. If, for instance, there is a bug in a specific flow, the right correction can be only simulated but a mask request is needed in order to check the real behavior of the modifications on the new silicon.

In one possible approach to address the problem, programmable fuses are used in order to create the option to alter critical circuits, to match some ill-defined technology parameters. A first disadvantage is the high area cost because options are programmable fuses that by their nature require a particular array organization and dedicated algorithm to be programmed and erased. Another disadvantage is that with this method the variables—and their ranges that can be changed via fuses—should be known and hence fixed before first prototype chip is out. Obviously, possible bugs cannot be known before they appear, so in some cases the fuses could not be able to correct these bugs or could not help in finding a different solution to problems that arise.

Another possible approach consists in introducing an embedded RAM that could be used during testing operations instead of the embedded ROM, in order to check each flow modification. Once the optimal code has been found, it could be implemented by one definitive mask that allows changing the on-chip ROM. The disadvantage of this approach is in terms of area since a RAM core is introduced with the related cells needed for decoding during read and write access. Moreover, new routines to manage the RAM controller must be introduced in the existent algorithm.

FIG. 1 is a diagram showing the architecture for a typical prior-art flash memory. The microcontroller 10 executes instructions from ROM 12 and controls all the circuitry for voltage generation and management in voltage generator 14 and address decoding for row decoder 16 and column decoder 18 coupled to memory array 20. Output data from the memory array 20 is presented by output buffers 22. Moreover, information concerning timings, fails, and attempts is stored in dedicated digital circuitry 24.

The particular code that has to be executed depends on the command issued by the user and interpreted by the Command User Interface (CUI) 26. The T-latch block 28 in FIG. 1 includes a group of dedicated latches (t-latches) used only during the tests of the device whether to check the functionality of some circuitry or to execute some operations not accessible by the user. A well-defined command sequence (not known by the user) is provided to the CUI 26 to set these t-latches.

The CUI 26 sends commands to the microcontroller 10. To execute the commands, the microcontroller sends selection signals to digital circuitry 24 and voltage generator 14 and receives query signals from digital circuitry 24. The digital circuitry 24 sends decoding signals to the row decoder 16 and column decoder 18 to select cells for testing or for user-mode standard operations such as read, program, and erase.

FIG. 2 is a diagram illustrating the matrix organization and decoding of instructions from a prior-art ROM such as ROM 12 shown in FIG. 1. In an exemplary ROM 12 storing 1,024 instructions, the instructions available to the microcontroller 10 of FIG. 1 are stored in the ROM matrix array 20, organized in 64 rows and 256 columns. As is well understood by persons of ordinary skill in the art, each instruction is read by using row decoder 16 to select one row (by activating the corresponding ROW_SEL signal) and using column decoder 18 to select a group of sixteen columns (a word) from among the 256 available (by activating the corresponding COL_SEL signal). The ROM address (ROM_ADD) is a 10-bit bus in which four lines (ROM_ADD<3:0>) decode the selected group of sixteen of the column lines (COL_SEL<15:0>) while the other six lines (ROM_ADD<9:4>) decode the selected one of the row lines (ROW_SEL<63:0>).

BRIEF DESCRIPTION OF THE INVENTION

The present invention provides a very low cost new apparatus and method to check algorithm modifications or to introduce new algorithm flows in a flash memory device. The architecture of the present invention implements a method that makes it possible not only to test all desired code modifications of each routine, but also makes it possible to test new routines not present in the original code.

A flash memory includes input/output buffers, a memory array having memory cells coupled to the input/output buffers, and row and column decoders, and a voltage-generator circuit coupled to the row and column decoders. A microcontroller is coupled to the command user interface. An instruction read-only memory has an address bus coupled to the microcontroller and an instruction-data bus coupled to the ROM instruction data bus through switch instruction circuitry. A plurality of t-latches have inputs coupled to the input/output buffers and to a command user interface. Digital control circuitry has inputs coupled to the instruction data bus of the read-only memory and to the switch instruction circuitry, and outputs coupled to the row and column decoders. The switch instruction circuitry selectively routes instructions to the microcontroller from one of the read-only memory and the t-latches and routing test data from the t-latches to the digital circuitry.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention provides a very low cost new apparatus and method to check algorithm modifications or to introduce new algorithm flows in a flash memory device. The architecture of the present invention implements a method that makes it possible not only to test all desired code modifications of each routine, but also makes it possible to test new routines not present in the original code.

According to the present invention, the existing t-latches are combined with dedicated switch instruction logic to provide substitute instructions for all or a part of the instruction set stored in the ROM.

By way of a non-limiting example of the present invention, consider a flash memory having sixteen groups of t-latches, each group having sixteen t-latches. The group size depends on the data bus length, (e.g., usually 16 bits for the latest generation flash memories). Persons of ordinary skill in the art will appreciate that the number of groups in any circuit fabricated according to the principles of the present invention depends on the complexity of the design and on the circuitry that has to be checked during test. Persons of ordinary skill in the art will appreciate that the principles of the present invention can be applied to devices with different data bus or ROM configurations and with a different number of t-latches.

Figure 3:
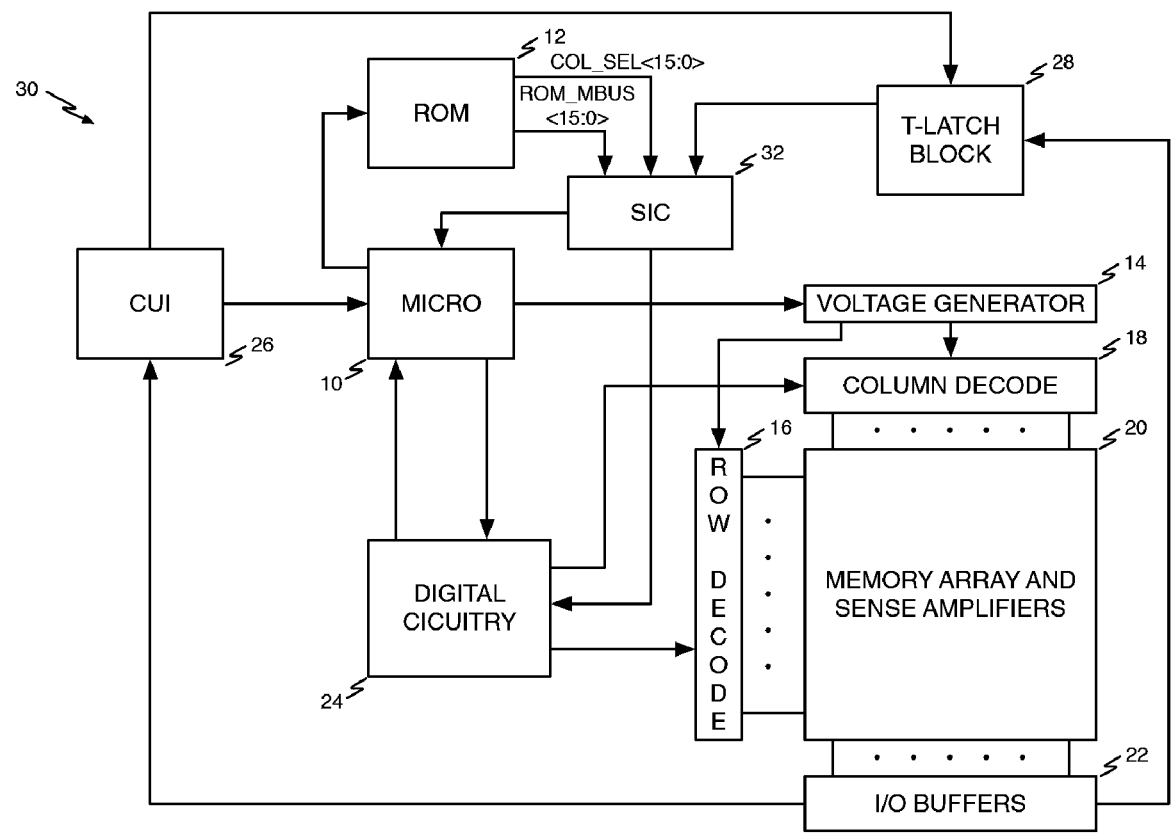
FIG. 3 is a diagram that illustrates an architecture for a memory according to one aspect of the present invention that includes switch instruction circuitry.

Referring now to FIG. 3, a block diagram illustrates an architecture 30 that implements one aspect of the present invention. Some of the circuit elements in FIG. 1 are also present in FIG. 3 and will be referred to using the same reference numerals used in FIG. 1.

Figure 1:
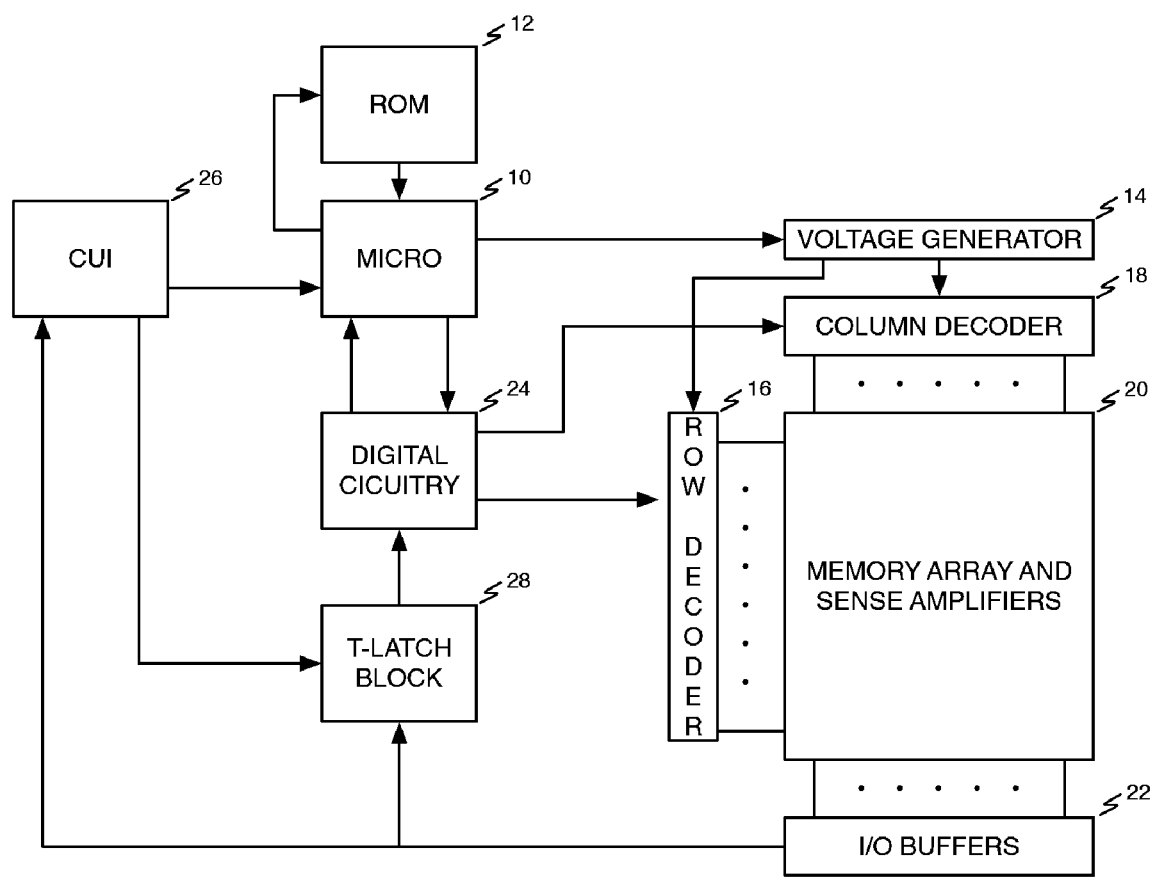
FIG. 1 is a diagram showing an illustrative prior-art flash memory architecture.
Figure 2:
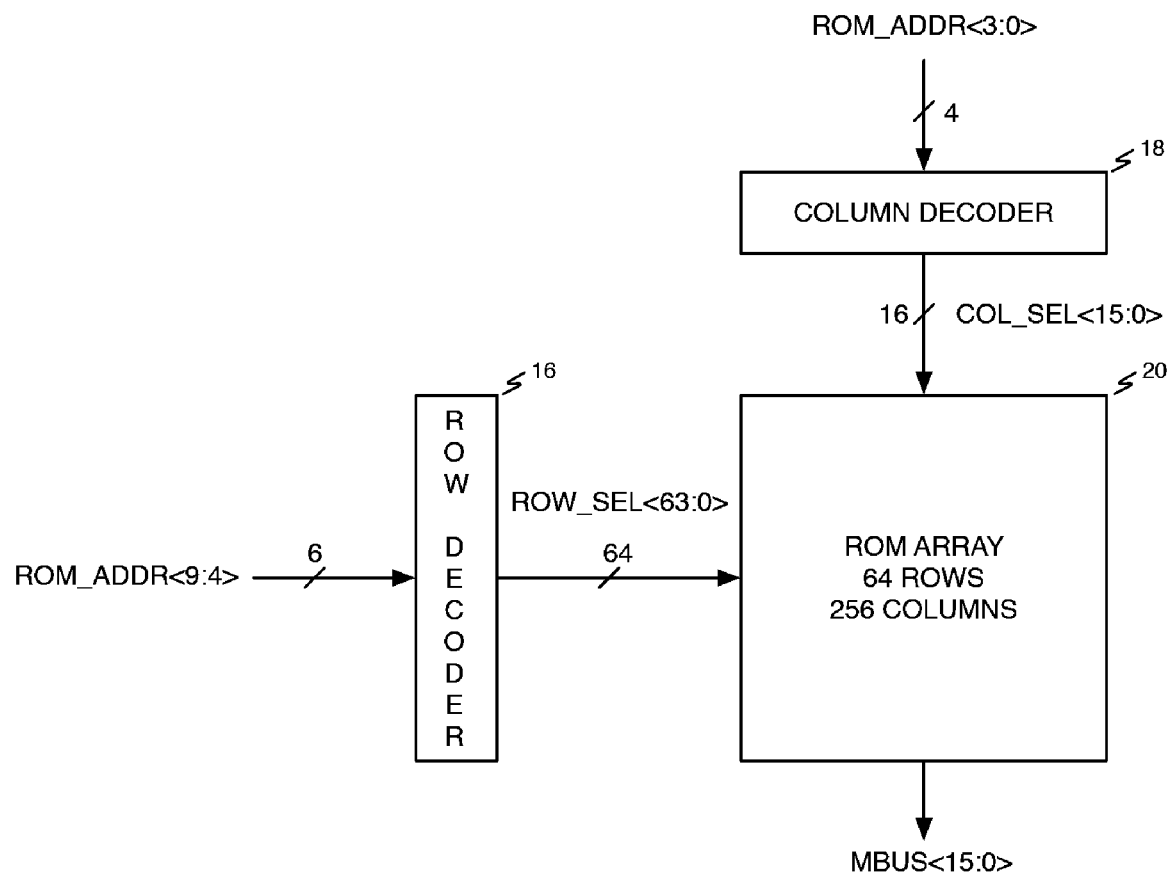
FIG. 2 is a diagram illustrating the matrix organization and decoding of instructions from a prior-art ROM such as the one shown in FIG. 1.

The architecture of FIG. 3 differs from the prior arrangement shown in FIG. 1 by the introduction of the switch instruction circuitry (SIC) block 32 that routes instructions to the microcontroller 10. The SIC block 32 is switching circuitry added in order to implement the present invention by selectively supplying the microcontroller with instructions stored in ROM 12 or with instructions supplied from off chip through the t-latch block 28. The COL_SEL<15:0> signals used inside SIC circuitry 32 are the same ones generated in the ROM column decoder 18 of FIG. 1 shown in more detail in FIG. 2.

In the prior-art approach shown in FIG. 1, data stored in t-latch groups are used to check circuits in the device. Each t-latch (if set) permits checking a specific circuit by driving the digital circuitry 24. This function of the t-latch circuits is well understood by persons of ordinary skill in the art. In the architecture according to the present invention, the outputs of the t-latches in t-latch block 28 are provided to the SIC block 32, which manages providing t-latch data to the digital circuitry 24 as in the prior art systems as well as providing off-chip instructions to the microcontroller 10. In this way the prior-art functionality of the t-latches is maintained and their functionality is enhanced according to the present invention.

Figure 4A:
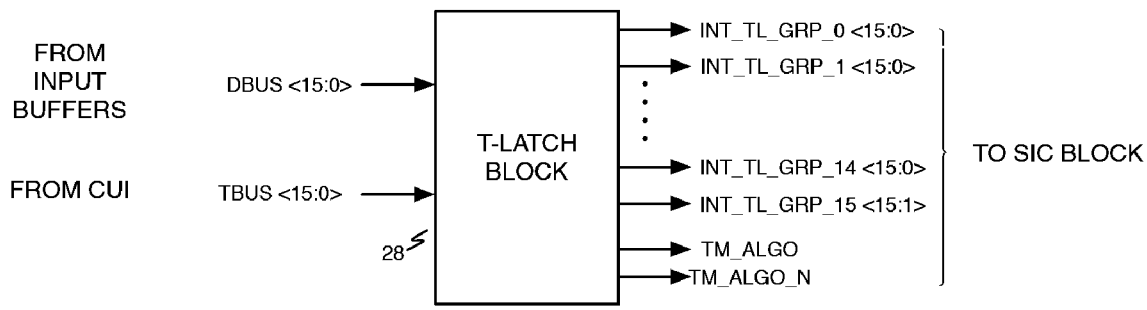
FIG. 4A is a diagram illustrating the input and output signals of the t-latch block of the circuit of FIG. 3.
Figure 4B:
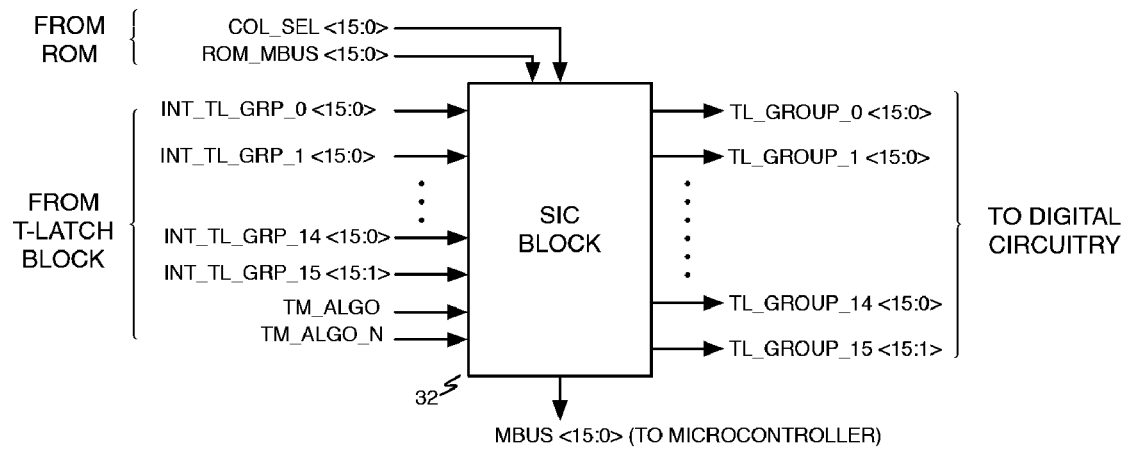
FIG. 4B is a diagram illustrating the input and output signals of the SIC block of the circuit of FIG. 3.

Referring now to FIGS. 4A and 4B, the input and output signals of the t-latch block 28 and SIC block 32 are shown. Depending on the signals from t-latch block 28 and from ROM 12, the SIC block 32 provides instructions to the microcontroller 10 (placed on the 16-bit bus MBUS) that serve to implement both the prior-art t-latch functions and the features of the present invention. The SIC block 32 also provides the signals to properly drive the digital circuitry 24 to implement all of the testing functionalities.

Referring now to FIG. 4A, the inputs to t-latch block 28 are signals DBUS<15:0> from I/O buffers 22 of FIG. 3 and signals TBUS<15:0> from CUI 26. The outputs from t-latch block 28 include signal groups INT_TL_GRP_0<15:0> through INT_TL_GRP_14<15:0> that are provided to SIC block 26, together with signal groups INT_TL_GRP_15<15:1>, and the signal TM_ALGO (and its complement TM_ALGO_N). Both TM_ALGO and TM_ALGO_N are used by the SIC block 32.

Referring now to FIG. 4B, the inputs to SIC block 32 are the COL_SEL<15:0> signals and ROM_MBUS<15:0> signals from ROM 12, the signals in the groups INT_TL_GRP_0<15:0> through INT_TL_GRP_14<15:0>, the signals in the group INT_TL_GRP_15<15:1>, and the signals TM_ALGO and its complement TM_ALGO_N from t-latch block 28. The outputs from SIC block 32 are TL_GROUP_0<15:0> through TL_GROUP_14<15:0> and TL_GROUP_15<15:1> that are provided to digital circuitry 24 and MBUS<15:0> provided to the microcontroller 10.

As can be seen from an examination of FIGS. 4A and 4B, the t-latch block 28 and the SIC block 32 act together to provide the prior-art function of supplying t-latch data to use in testing as in the prior art systems, and to provide the additional function of using the t-latch block 28 to provide instructions from off chip through the I/O buffers 22 to be executed by the microcontroller 10.

Figure 5A:
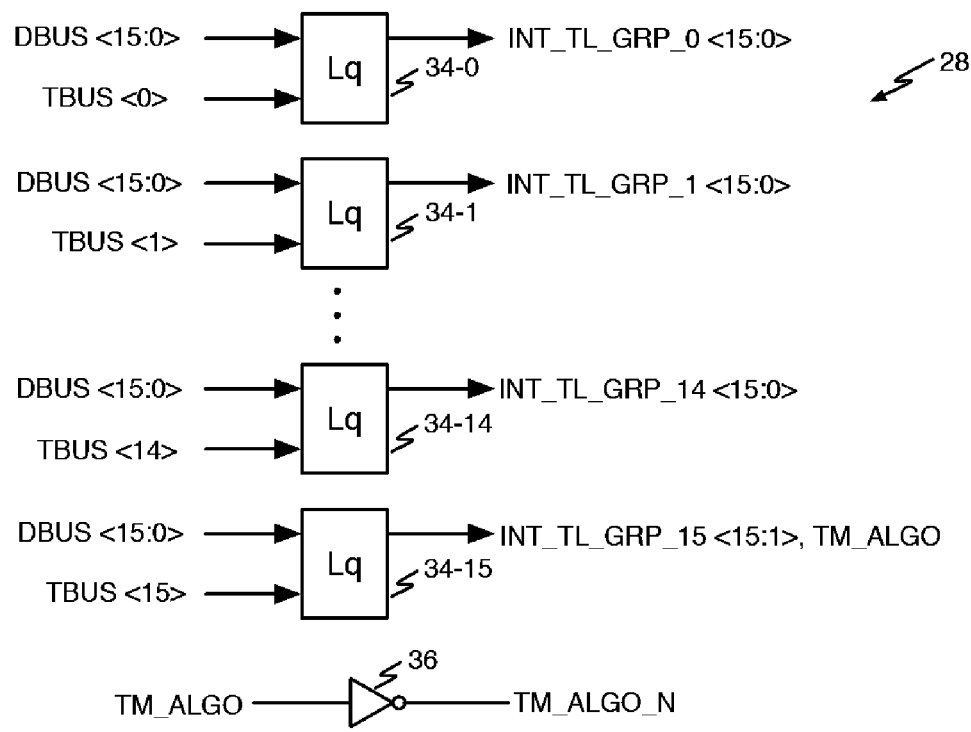
FIG. 5A is a block diagram showing exemplary circuitry that may be used to implement the features of the t-latch block of FIG. 4A.
Figure 5B:
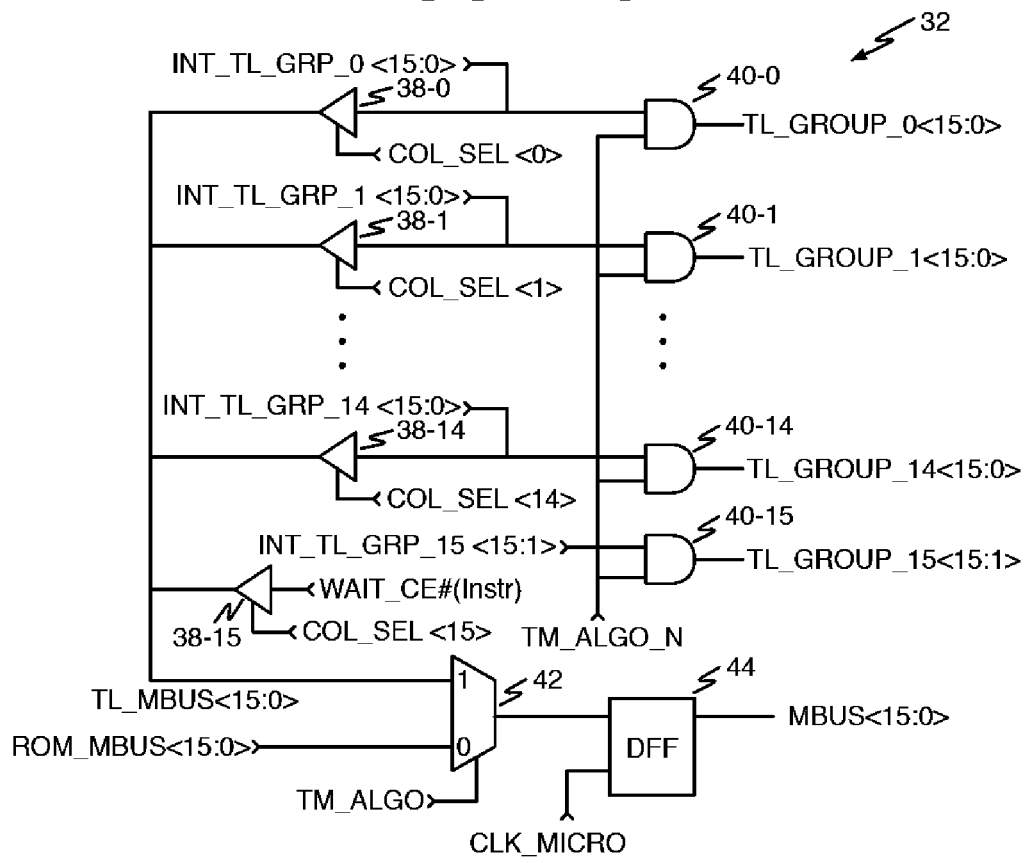
FIG. 5B is a block diagram showing exemplary circuitry that may be used to implement the features of the SIC block of FIG. 4B.

Referring now to FIGS. 5A and 5B, block diagrams show exemplary circuitry that may be used to implement the features of the SIC and t-latch blocks. Referring now to FIG. 5A, representative ones of the latches for groups 0 through 15 in t-latch block 28 are shown at reference numerals 34-0, 34-1, 34-14, and 34-15. Each latch is 16 bits wide and the data inputs of all latches are coupled to the data bus lines DBUS<15:0>. All latches are clocked by a corresponding one of the TBUS lines TBUS<0> through TBUS<15> from CUI 32.

The output line for INT_TL_GRP_15<0> is the TM_ALGO line. The signal TM_ALGO is complemented in inverter 36 to produce the signal TM_ALGO_N.

Referring now to FIG. 5B, the SIC block includes a set of buffers and AND gates for each set of signals INT_TL_GRP_0<15:0> through INT_TL_GRP_14<15:0> and the signals INT_TL_GRP_15<15:1>. Representative ones of the buffers and AND gates for groups 0 through 15 in SIC block 32 are shown at reference numerals 38-0 and 40-0, 38-1 and 40-1, and 38-15 and 40-15. Group 15 is used only for memory device testing and not to provide external instructions, since its first bit <0> is the TM_ALGO signal.

Two operating modes can be chosen by setting or not the bit <0> of t-latch 34-15 whose output is TM_ALGO. The first mode is a conventional test mode. When TM_ALGO is low (i.e. the bit <0> of t-latch 34-15 is not set), the outputs of the t-latches 34-0 through 34-15 are passed on the TL_GROUP_0<15:0> through TL_GROUP_15<15:1> lines by the AND gates 40-0 through 40-15 because the signal TM_ALGO_N is high. These control signals can be used in the prior-art testing modality to check any single circuit or chip functionality. In this mode, multiplexer 42 passes the instruction data from the embedded ROM (ROM_MBUS<15:0>) to the microcontroller instruction bus (MBUS) through DFF 44 on the microcontroller clock. In this mode the microcontroller executes the code stored in the ROM.

The second mode is a simple algorithm modify mode (SAMM). When TM_ALGO is high (i.e. the bit <0> of t-latch 34-15 is set), all the TL_GROUP_0<15:0> through TL_GROUP_15<15:1> lines are disabled by the AND gates 40-0 through 40-15 since the TM_ALGO_N signal is low. Buffers 38-0 through 38-15 are enabled by the corresponding COL_SEL<0> through COL_SEL<15> signals used to decode the column address of the ROM (see FIG. 2), thus sequentially passing the outputs of the t-latches 34-0 through 34-14 plus the fixed 16-bit instruction "WAIT-CE#" to TL_MBUS<15:0> and through the multiplexer 42 to the MBUS through DFF 44. In this mode, the microcontroller 10 will execute the instructions sequentially placed on the bus TL_MBUS<15:0>, i.e. the instructions externally set into the t-latches by the testing machine.

The architecture depicted in FIGS. 5A and 5B will operate correctly in the second mode if no JUMP or SUBROUTINE CALL instructions are decoded on the TL_MBUS<15:0> bus. If this rule is respected, the address counter implemented to generate the decoding signals ROM_ADD<9:0> for the ROM matrix will increment the decoded address at each clock cycle, and hence the COL_SEL<15:0> will be automatically scanned from the 0th to the 15th and the INT_TL_GRP_0<15:0> through INT_TL_GRP_14<15:0> plus the instruction "WAIT-CE#" will be sequentially placed on the TL_MBUS<15:0> line. In the approach of the present invention depicted in the figures, the ROM_ADD<9:4> states of the bits decoding the ROM matrix row are don't care. The count is a 16-module count, since only the COL_SEL<15:0> signals are significant.

Note that the group of t-latches 15 (that contains the TM_ALGO output signal) are not used to store instructions, since the instruction pointed by COL_SEL<15> is the fixed instruction "WAIT CE#". The reason of this is explained further herein.

In a complete COL_SEL<15:0> scanning, only 15 (+1 "WAIT CE#") instructions can be executed. A communication protocol that would allow the execution of an arbitrary number of instructions is implemented according to the present invention. A proposed protocol is shown in FIG. 6.

Figure 6:
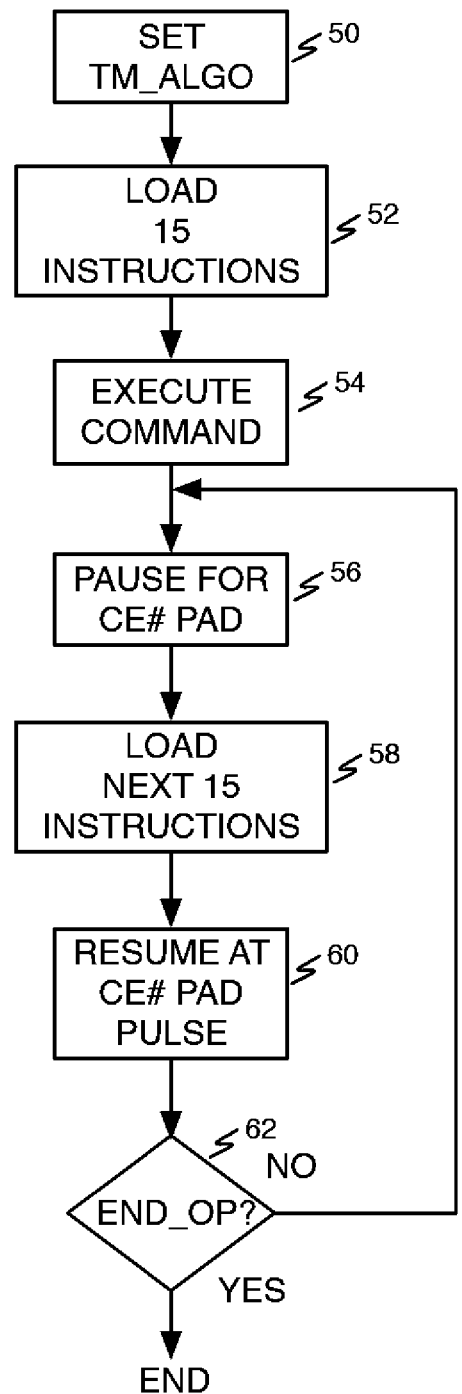
FIG. 6 illustrates a proposed communication protocol that may be used to enter and implement SAMM modality according to the present invention.

FIG. 6 illustrates execution of a proposed communication protocol that may be used to enter and implement the SAMM modality according to the present invention. First, as shown at reference numeral 50, the TM_ALGO t-latch is set in the same way a typical t-latch is set. Next, at reference numeral 52, the first 15 groups of t-latches are loaded with the first 15 instructions of algorithm that should be implemented. Next, at reference numeral 54, the desired command that can be recognized by the device CUI (e.g., word program, buffered program, erase, etc.) is provided. Upon receipt of the command, the system clock starts and the microcontroller executes the first 15 instructions stored in the INT_TL_GR_0<15:0> through INT_TL_GR_14<15:0> and automatically selected by the COL_SEL<15:0> signals in the order COL_SEL<0>, COL_SEL<1>... COL_SEL<14>.

At the sixteenth instruction window when the COL_SEL<15> signal is active, the instruction provided to the microcontroller 10 through buffer 38-15 in FIG. 5B is "WAIT CE#" as shown at reference numeral 56. This instruction causes the algorithm to freeze until a low-to-high transition is sensed on the CE# I/O pad of the chip. The next 15 groups of t-latches are loaded with the next 15 instructions at reference numeral 58 while the CE# pad is kept low. During this operation the algorithm is frozen in the "WAIT CE#" state.

When the instruction loading has been completed, a pulse on the CE# I/O pad is needed, having a "1" state with a width that must be longer than 1 microcontroller clock period and shorter than 15 clock periods. As a consequence the microcontroller recognizes the "1" state of the CE# pad and at reference numeral 60 exits the "WAIT CE#" state: the new 15 instructions loaded on the INT_TL_GRP_0<15:0> through INT_TL_GRP_14<15:0> will be executed. After 15 clock periods the algorithm will enter a new "WAIT CE#" frozen state. This is repeated until all the desired instructions have been loaded and executed.

The algorithm is stopped by loading the preferred instruction "SET END_OP", that will be internally recognized by the microcontroller as the last instruction executed in any algorithm flow as shown at reference numeral 62. This instruction switches off the clock system and ends the algorithm.

Figure 7:
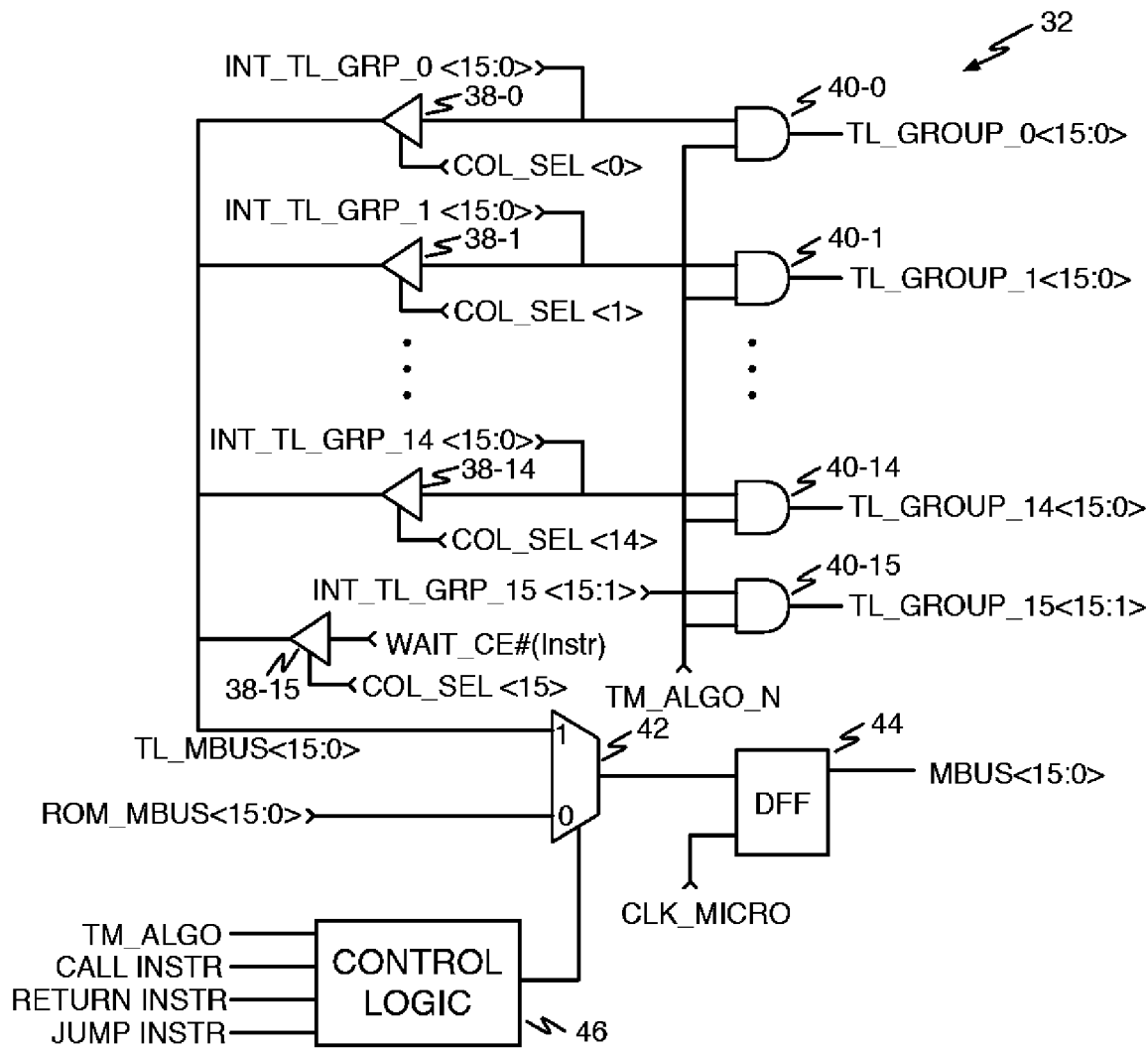
FIG. 7 is a block diagram showing exemplary circuitry that may be used to implement the features of the SIC block of FIG. 4B that allows the execution of JUMP or SUBROUTINE CALL instructions according to the present invention.

FIG. 7 is a block diagram showing exemplary circuitry that may be used to implement the features of the SIC block of FIG. 4B that allows the execution of JUMP or SUBROUTINE CALL instructions to be decoded on the TL_MBUS<15:0> line according to the present invention.

Basically the circuitry shown in the same as that of FIG.5B, with the exception of the block CONTROL LOGIC 46, whose output drives the multiplexer MUX fed by ROM_MBUS<15:0> and TL_MBUS<15:0> lines. The inputs of the CONTROL LOGIC block are the TM_ALGO signal and the JUMP, CALL, and RETURN signals. The CONTROL LOGIC 46 may be configured in any way that implements the following rules.

The multiplexer 42 input is switched to ROM_MBUS<15:0> and hence the instructions executed by the microcontroller are the ones stored in the ROM matrix under the condition where TM_ALGO is low or TM_ALGO is high and a CALL (or JUMP) instruction has been read on the TL_MBUS<15:0> line. The instructions of the called subroutines are subsequently executed from the ROM matrix, until a RETURN instruction is read. This will cause the CONTROL LOGIC 46 to switch the input of multiplexer 42 back to the TL_MBUS<15:0> line.

The input of multiplexer 42 is switched to TL_MBUS<15:0> and hence the executed instructions are the ones decoded by the INT_TL_GRP(j)<15:0> buses when TM_ALGO is high and no SUBROUTINE CALL or JUMP instruction has been read on TL_MBUS<15:0> line. If a SUBROUTINE CALL or JUMP instruction is placed on TL_MBUS<15:0> line, the CONTROL LOGIC switches the input of multiplexer 42 to the ROM_MBUS<15:0> lines, the subroutine instructions are executed from the ROM matrix, and if a RETURN instruction occurs, the CONTROL LOGIC 46 switches the input of multiplexer 42 back to the TL_MBUS<15:0> lines.

The above-described modality is referred to as extended algorithm modify mode (EAMM), and is a more flexible and powerful way of implementing the proposed invention. Nevertheless, a simple CONTROL LOGIC circuit 46 is needed to control the multiplexer whose output feeds to the microcontroller the instruction to be executed.

The ability of the present invention to change the algorithm on the existing silicon is useful for two major reasons. First, the results of the proposed corrections are available in real time and there is no need to invest additional time and money to design and implement new masks before the implemented solution can be tested on-silicon. In addition, the proposed corrections in the algorithm flows are safe only once they are tested on silicon and the present invention allows such testing. The present invention is therefore advantageous in terms of reliability and saving of on-chip area, money and time.

In addition, the advantages of the present invention in terms of reliability and area occupation arise from the fact that it allows performance testing of modified and new algorithms by using most of the circuitry already present in a typical flash memory, along with the aforementioned saving of time and money.

The present invention offers great flexibility for checking any algorithm flow without or with JUMP or SUBROUTINE CALL instructions, in order to test some existing or new routines without writing the ROM matrix. Additional area occupation is very small because only the simple control logic of the SIC circuitry has been added. The solution is innovative because it solves the problem of how to test a new algorithm by using existing test-dedicated on-chip circuitry, without the introduction of any new memory location to implement the alternative algorithm. The approach offered by the present invention also ensures that any bug correction is ok before the request of a new mask set, hence saving time and money in the production.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a non-volatile memory integrated circuit, a method for executing test instructions from on-chip testing circuitry including a microcontroller including;
   providing, in a first mode of operation, instructions to be executed by the microcontroller from an instruction set disposed in an on-chip ROM;
   providing, in a second mode of operation, instructions to be executed by the microcontroller from an off-chip source; and
   switching between the first mode of operation and the second mode of operation in response to commands provided from off chip,
   wherein providing, in a second mode of operation, instructions to be executed by the microcontroller from an off-chip source includes loading instructions to be executed by the microcontroller from an off-chip source to a group of t-latches disposed on the integrated circuit,
   wherein switching between the first mode of operation and the second mode of operation comprises providing the instructions to be executed by the microcontroller from an on-chip switch instruction circuit coupled to the ROM and to the group of t-latches, and
   wherein a number of instructions greater than the number of t-latches is provided from off chip by providing the instructions in groups of n instructions, the nth instruction in each group being a WAIT instruction that pauses the microcontroller while a next group of instructions is loaded into the group of t-latches.

2. The method of claim 1 wherein commands for controlling the switching between the first mode of operation and the second mode of operation originate from data provided to at least one t-latch in the group of t-latches.

3. The method of claim 1 wherein a last instruction provided from off chip is an END_OP instruction.

4. The method of claim 1 wherein switching between the first mode of operation and the second mode of operation further comprises switching between the first mode of operation and the second mode of operation in response to a JUMP instruction.

5. The method of claim 1 wherein switching between the first mode of operation and the second mode of operation further comprises switching between the first mode of operation and the second mode of operation in response to one of a SUBROUTINE CALL instruction and a RETURN instruction.

* * * * *